(12) United States Patent
Arndt

(10) Patent No.: US 8,558,271 B2
(45) Date of Patent: Oct. 15, 2013

(54) HOUSING FOR AN OPTOELECTRONIC COMPONENT

(75) Inventor: Karlheinz Arndt, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 164 days.

(21) Appl. No.: 13/120,348

(22) PCT Filed: Aug. 31, 2009

(86) PCT No.: PCT/DE2009/001223
§ 371 (c)(1),
(2), (4) Date: Jun. 13, 2011

(87) PCT Pub. No.: WO2010/031373
PCT Pub. Date: Mar. 25, 2010

(65) Prior Publication Data
US 2011/0303944 A1    Dec. 15, 2011

(30) Foreign Application Priority Data

Sep. 22, 2008  (DE) .......................... 10 2008 048 259

(51) Int. Cl.
*H01L 33/00* (2010.01)

(52) U.S. Cl.
USPC .............. 257/99; 257/E33.058; 257/E33.066; 438/26; 174/533; 264/272.14

(58) Field of Classification Search
USPC ........... 257/99, 678, 690, 692, 693, 695, 696, 257/E33.058, E33.066; 438/22, 26; 174/50, 174/520, 521, 527, 528, 532, 533; 264/239, 264/241, 259, 271.1, 272.11, 272.14
See application file for complete search history.

(56) References Cited

U.S. PATENT DOCUMENTS

| 4,642,419 | A  | * | 2/1987 | Meddles | 174/552 |
| 5,116,229 | A  |   | 5/1992 | Savage, Jr. | |
| 6,335,548 | B1 | * | 1/2002 | Roberts et al. | 257/98 |
| 6,376,902 | B1 |   | 4/2002 | Arndt | |
| 6,433,417 | B1 | * | 8/2002 | Aoyama | 257/696 |
| 7,045,905 | B2 | * | 5/2006 | Nakashima | 257/787 |
| 7,429,757 | B2 | * | 9/2008 | Oyama et al. | 257/98 |
| 7,524,087 | B1 | * | 4/2009 | Aizar et al. | 362/267 |
| 7,531,845 | B2 | * | 5/2009 | Oshio et al. | 257/98 |
| 7,923,739 | B2 | * | 4/2011 | Hussell | 257/88 |
| 8,049,230 | B2 | * | 11/2011 | Chan et al. | 257/89 |
| 8,089,075 | B2 | * | 1/2012 | Chuan et al. | 257/81 |
| 8,120,055 | B2 | * | 2/2012 | Norfidathul et al. | 257/99 |
| 8,334,548 | B2 | * | 12/2012 | Kobayakawa | 257/99 |

(Continued)

FOREIGN PATENT DOCUMENTS

DE    102 14 208    10/2003
EP      0 200 462   11/1986

(Continued)

*Primary Examiner* — Fernando L Toledo
*Assistant Examiner* — Victoria K Hall
(74) *Attorney, Agent, or Firm* — Cozen O'Connor

(57) ABSTRACT

A housing for an optoelectronic component comprises a housing body and first and second electrical terminal strips. The first and second terminal strips extend in part inside the housing body and are guided out of the housing body at a first side face. Outside the housing body the two terminal strips are bent in such a way that they comprise a first portion extending at an angle to the first side face, and a second portion (11d, 12d) extending along and spaced from the first side face. A method for producing such a housing is also described.

14 Claims, 4 Drawing Sheets

(56) References Cited

U.S. PATENT DOCUMENTS

| | | | |
|---|---|---|---|
| 2001/0001504 A1* | 5/2001 | Sugiyama et al. | 257/666 |
| 2003/0027372 A1* | 2/2003 | Tsuji | 438/106 |
| 2005/0189635 A1* | 9/2005 | Humpston et al. | 257/678 |
| 2006/0197103 A1* | 9/2006 | Arndt | 257/99 |
| 2007/0007640 A1* | 1/2007 | Harnden et al. | 257/690 |
| 2007/0235845 A1* | 10/2007 | Xuan et al. | 257/676 |
| 2009/0267107 A1* | 10/2009 | Weber-Rabsilber et al. | 257/99 |
| 2010/0163918 A1* | 7/2010 | Kim et al. | 257/99 |

FOREIGN PATENT DOCUMENTS

| | | | |
|---|---|---|---|
| EP | 0 400 175 | | 12/1990 |
| EP | 1 858 089 | | 11/2007 |
| WO | WO 99/07023 | | 2/1999 |
| WO | WO 2007/141664 | | 12/2007 |
| WO | WO 2008/074286 | * | 6/2008 |

* cited by examiner

A-A'

HOUSING FOR AN OPTOELECTRONIC COMPONENT

RELATED APPLICATIONS

This is a U.S. national stage of application No. PCT/DE2009/001223, filed on Aug. 31, 2009.

This application claims the priority of German application no. 10 2008 048 259.5 filed Sep. 22, 2008, the entire content of which is hereby incorporated by reference.

FIELD OF THE INVENTION

The present invention is related to a housing which is suitable in particular for a side emitting component, or "side emitter" and to a method of producing such a housing.

SUMMARY OF THE INVENTION

One object of the present invention is to provide a housing with improved stability.

A further object is to provide a simple method of producing such a housing.

According to a preferred embodiment, the housing is formed of a housing body and a first and a second terminal strip. The first and second terminal strips are in particular provided for electrical supply of an optoelectronic semiconductor chip, which may be arranged in the housing. Furthermore, the terminal strips are advantageously suitable for dissipating heat arising in operation out of the housing.

The housing body comprises a first side face, which is arranged at an angle, i.e. not parallel, to a front and a back of the housing body. The terminal strips extend in part inside the housing body and are guided out of the housing body at the first side face. Outside the housing body the terminal strips are bent in such a way that they comprise a first portion, which extends at an angle, preferably perpendicularly, to the first side face, and a second portion, which extends with spacing along the first side face.

In one advantageous configuration of the housing the spacing between the first side face and the second portions of the terminal strips is between 0.4 mm and 0.6 mm in size. In particular the spacing amounts to 0.5 mm.

The first and second terminal strips are preferably arranged parallel to one another. In addition, they advantageously extend both inside and outside the housing body in a common plane. Furthermore, the terminal strips in particular comprise no more than one bend.

An embodiment of the invention is based in particular on the idea that, for the long-term stability of the component, heat transfer out of the component must function well, in order to reduce heat-induced damage.

In this context, relatively thick terminal strips have proven advantageous. Preferably, the terminal strips are at least 0.2 mm thick. Particularly preferably, the terminal strips have a thickness of at least 0.3 mm.

Suitable materials for the terminal strips are metals, metal compounds or materials containing metal. Preferably, the terminal strips are made of a copper alloy. Particularly preferably, the terminal strips consist of CuCrSiTi (K75).

Suitable materials for the housing body are plastics, in particular thermoplastics. Since these are readily deformable, the heat transfer improved as a result of the thicker terminal strips has a particularly advantageous effect on the long-term stability of the housing body. Preferably, polyphthalamide (PPA) is used for the housing body.

The housing is advantageously surface-mountable, i.e. it may be mounted on a printed circuit board or other terminal carrier and connected electrically thereto in a wireless manner. To this end, the housing is placed on the terminal carrier in such a way that the first side face faces the terminal carrier. The two terminal strips then likewise face the terminal carrier, the second portions of the terminal strips extending in particular along the terminal carrier. With the aid of a joining agent, for example a solder, the second portions of the terminal strips may be connected to the terminal carrier both mechanically and electrically.

According to an advantageous further development, the second portions of the terminal strips form an angle with the terminal carrier which is greater than 0°. Preferably, the angle amounts to between 1° and 2°. The angle between the respective first and second portions is at the same time greater than 90°. This has the consequence that the second portions extend slightly obliquely relative to the terminal carrier, whereby a small space is formed between the second portions and the terminal carrier, in which the joining material may advantageously collect and thus ensure good coupling between terminal strips and terminal carrier.

In a preferred configuration the housing comprises supporting elements, which are connected to the housing body and project out of the plane of the first side face. The supporting elements are intended for supporting the housing on the side with the terminal strips. Preferably, the supporting elements are formed in one piece with the housing body.

According to one advantageous embodiment the supporting elements have a height which corresponds at least to the spacing between the second portions and the first side face plus the thickness of the terminal strips. Thus the supporting elements project at least as far out of the plane of the first side face as do the terminal strips. In particular, the housing does not rest on a terminal carrier by way of the terminal strips but rather by way of the supporting elements. This simplifies flat arrangement of the housing on the terminal carrier irrespective of the profile of the terminal strips. The position of the housing relative to the terminal carrier may be fixed by the supporting elements. Thus, for example, a slightly oblique profile of the terminal strips relative to the terminal carrier does not have a negative effect on the position of the housing.

The supporting elements may for example be elongate in shape. In particular, the supporting elements may extend from the front to the back of the housing body. This ensures stable positioning of the housing on a terminal carrier.

Preferably, the supporting elements extend parallel to the second portions of the terminal strips, the terminal strips being arranged between the supporting elements. The supporting elements form a tunnel-like cavity, in which the terminal strips are located. The terminal strips are exposed at the front of the housing body, which enables examination of the joining agent, in particular the solder fillet, after mounting of the housing. This allows improved quality control.

According to a preferred embodiment, the two terminal strips are separated from one another by a gap, which is smaller especially outside the housing body than the width of the supporting elements. This prevents the supporting elements of one housing from becoming jammed between the terminal strips of another housing during transportation of a plurality of housings.

In one advantageous configuration the housing body comprises a cavity at the back. This has manufacturing-related advantages. In particular, in this way blowhole formation may be reduced in the event of production of the housing body by means of injection moulding.

In addition, the terminal strips advantageously extend as far as into the cavity. Thus, the terminal strips may be accessed from the back. This means, for example, that a post-processing of the soldered joint is still possible after the housing has been mounted on a terminal carrier.

The cavity is defined by a rear wall and a second, third and fourth side wall of the housing body. An outward facing side face of the second side wall, which is designated second side face, is arranged parallel to the first side face. The second side wall advantageously projects beyond the terminal strips, so forming a cover therefor, such that the terminal strips are protected from above. Furthermore, the second side face serves as a suction face, by means of which the housing may be held during installation. To prevent unfavourable tipping of the housing, the second side face is advantageously square in shape. The third and fourth side walls are arranged at an angle, preferably perpendicularly, to the first side wall. These side walls are not continuous, but rather comprise openings which lead in particular into the rear cavity of the housing body. The openings in the third and fourth side walls are advantageously opposite one another, such that a holder may be straightforwardly inserted through the openings. The holder may stabilise the housing for example during securing of a bonding wire.

According to a preferred embodiment the housing body comprises a recess at the front which is provided for accommodating an optoelectronic semiconductor chip. An extension, extending inside the housing body, of the first terminal strip advantageously projects into the recess. The semiconductor chip may be arranged on the extension and connected electrically thereto. Furthermore, an internal wall laterally defining the recess may comprise a hole in which part of the second terminal strip is exposed. The semiconductor chip may be connected to this part by means of a bonding wire.

In a preferred variant of a side emitting component, the latter comprises a housing according to one of the above-described configurations and a radiation emitting semiconductor chip arranged inside the housing body, the component being arranged on a terminal carrier in such a way that the second portions of the terminal strips extend along the terminal carrier and are connected to the terminal carrier by an electrically conductive joining agent. The main direction of radiation of the component extends parallel to the terminal carrier. Emission from the housing body proceeds at the front, i.e. on the side with the recess.

The radiation emitting semiconductor chip comprises an active zone with a pn-junction for generating radiation. In the simplest case, this pn-junction may be formed by means of a p-conducting and an n-conducting semiconductor layer, which directly adjoin one another. Preferably, the actual radiation-producing structure is provided between the p-conducting and n-conducting layers, for instance in the form of a doped or undoped quantum structure. The quantum structure may take the form of a single quantum well structure (SQW) or multiple quantum well structure (MQW) or indeed as a quantum wire or quantum dot structure.

The semiconductor chip preferably comprises a compound semiconductor material such as $Al_nGa_mIn_{1-n-m}P$ or $Al_nGa_mIn_{1-n-m}N$, in which $0 \leq n \leq 1$, $0 \leq m \leq 1$ and $n+m \leq 1$.

According to a preferred variant of a method of producing a housing as described above, a terminal frame having a first and a second flat terminal strip is introduced into a shaping device, a first and a second portion of the terminal strips in each case projecting out of the device. In addition, the device is filled with a housing body compound for forming the housing body, such that the terminal strips are at least partially embedded in the housing body compound. The terminal strips are provided with a bend before or after completion of the housing body, such that in each case the first portion extends at an angle to the second portion.

The terminal frame comprises a frame-type area, which frames the first and second terminal strips. Each terminal strip is connected to the frame-type area by means of two connecting webs. After production of the housing body the connecting webs are severed from the frame-type area. The two terminal strips are then no longer joined together. They are partially embedded in the housing body as separate elements. Severing the connection between the terminal strips is important, to ensure that no short-circuit arises during operation of the component.

The housing is preferably produced by series production, which leads to inexpensive production of the housing. To this end, a terminal frame assembly with a plurality of terminal frames is advantageously used. For example, the terminal frame assembly may be a continuous tape.

In one advantageous embodiment of the method, the housing body is produced using an injection moulding method. A plastics material is preferably used as the housing body compound. Particularly preferably, the housing body is made from a thermoplastic material.

Injection moulding is a particularly advantageous method with regard to series production of the housing. In this case, the above-described terminal frame assembly may be introduced into an injection moulding machine with a plurality of shaping devices. The shaping devices are filled with the housing body compound, and individual housing bodies are formed. Once the housing bodies are completed, the terminal frame assembly may be singulated, so as to provide individual housings.

Where a side emitting component is being produced, singulation into individual components preferably takes place only after the semiconductor chip has been secured in the housing. In particular, the terminal frame assembly is either left as a continuous tape after production of the housing body or cut into approximately 20 cm long strips, each individual strip comprising a plurality of terminal frames.

The terminal strips may be provided with a bend before or after production of the housing body. In particular, the bend is brought about by bending the terminal strips.

If the terminal strips are bent after production of the housing body, the terminal strips may be clamped in the area of the first portions in such a way that no forces are introduced into the housing body during bending. In this way, damage to the housing may be reduced. In particular, if the forces become considerable, as in the case of thicker terminal strips, clamping proves to be an advantageous measure.

Bending the terminal strips before production of the housing body has the advantage that no bending forces have subsequently to be exerted on the housing body and thus no damage to the housing caused by bending forces is to be feared. However, moulding the housing body compound around the bent terminal strips may prove more complicated. The reason for this is that, in the area of the bend in the terminal strips, it is difficult to seal the shaping device in such a way that no housing body compound escapes from the device. The first portions therefore preferably extend parallel to a plane in which the device closes. In this way, the device may be closed in the area of the first portions so tightly that no compound escapes from the device during production of the housing body.

DETAILED DESCRIPTION OF THE DRAWINGS

Figure 1:
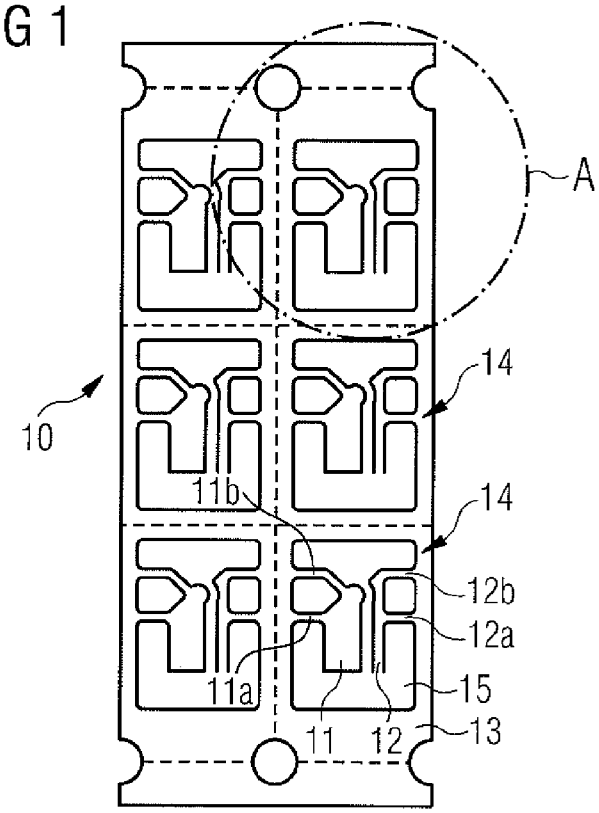
FIGS. 1 to 4 are schematic representations of various steps of a preferred variant of a method for producing a housing.

In the exemplary embodiments and figures, identical or identically acting components are in each case provided with the same reference numerals.

FIG. 1 shows production of a terminal frame assembly 10. In the process, openings 15 are introduced into a flat metal sheet by stamping (cf. also FIG. 2). The metal sheet is stamped out in such a way as to form a plurality of joined-together terminal frames 14. The metal sheet contains in particular a copper alloy, preferably CuCrSiTi (K75).

Each terminal frame comprises in each case a first terminal strip 11 and a second terminal strip 12 and a frame-type area 13, which frames the two terminal strips 11, 12. The first terminal strip 11 is joined to the frame-type area 13 by means of two connecting webs 11a, 11b. Likewise, the second terminal strip 12 is joined to the frame-type area 13 by means of two connecting webs 12a, 12b.

Figure 2:
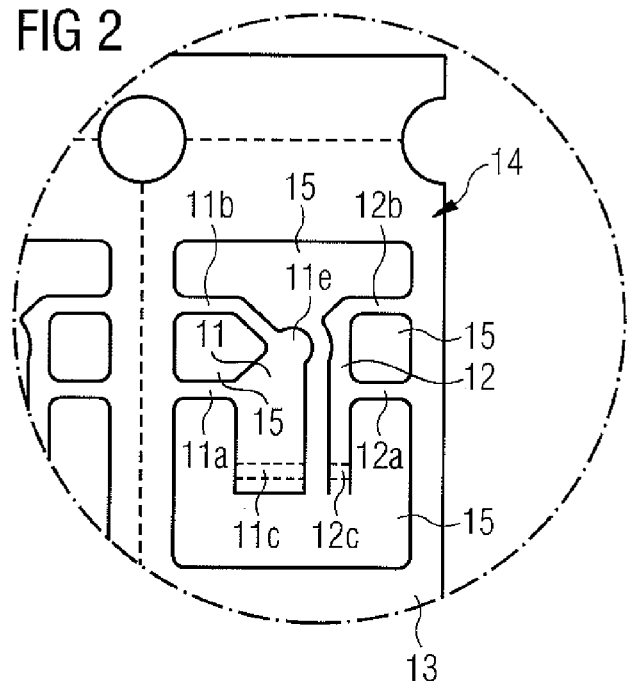

FIG. 2 shows an enlarged detail A of the terminal frame assembly. It is apparent that the two terminal strips 11, 12 comprise a bend as a result of a further method step. The bend is produced in particular by bending the two terminal strips 11, 12. The bend provides the two terminal strips 11, 12 with a bent shape, with in each case a first portion 11c, 12c extending at an angle to a second portion (not shown).

Figure 3:
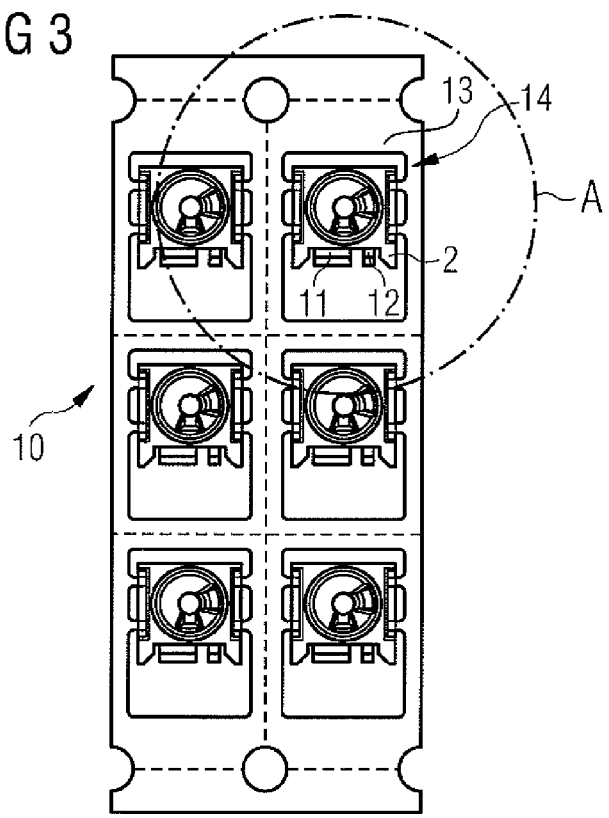

In a next step (cf. FIG. 3) the housing body 2 is produced. In particular, a plurality of housing bodies 2 are produced as the assembly. The connecting element is here the terminal frame assembly 10 with its joined-together terminal frame 14. A housing body 2 is in each case arranged in the stamped-out openings 15 in each terminal frame 14 in such a way that the two terminal strips 11, 12 are partially embedded in the housing body.

Figure 4:
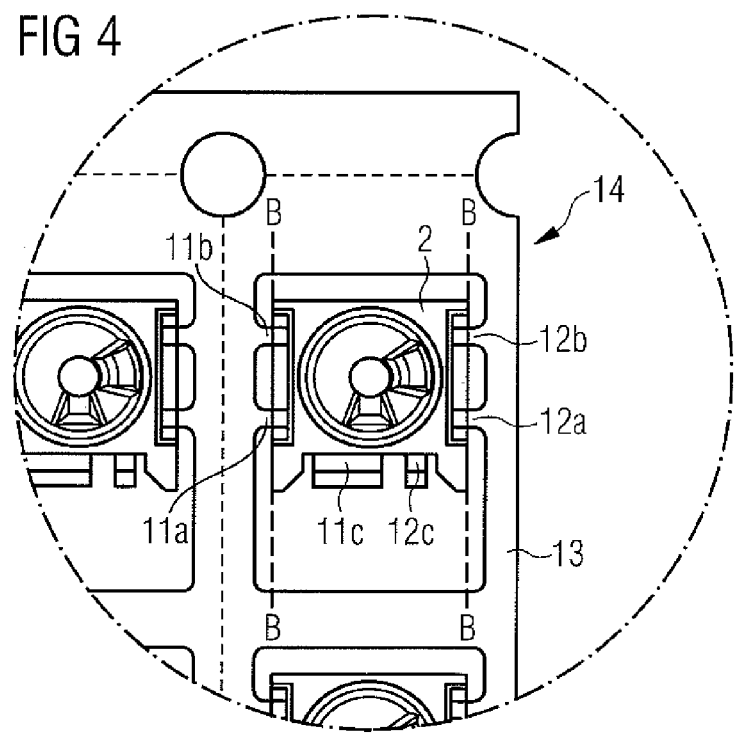

The housing bodies 2 are preferably injection-moulded. To this end, an injection moulding machine with a plurality of shaping devices (not shown) is used. The shaping devices close in the area of the first portions 11c, 12c. FIG. 4 shows an enlarged detail A of the assembly shown in FIG. 3, in which the first portions 11c, 12c are more readily visible.

Since the terminal strips 11, 12 are bent prior to production of the housing body 2, problems would arise on closure of the respective device in the bent area of the terminal strips 11, 12 if the first portions 11c, 12c were not present. These extend in the plane where the device closes, and thus enable proper sealing of the device on filling with housing body compound.

After curing of the housing body compound, the assembly is removed from the injection moulding machine. The assembly is divided along dividing lines B. In the process, the first and second terminal strips 11, 12 are separated from the frame-type area 13 at the connecting webs 11a, 11b, 12a, 12b. Thus, the first and second terminal strips 11, 12 are no longer joined together. A semiconductor chip, which is arranged in the housing, may be supplied with electricity by means of the two terminal strips 11, 12.

Figure 5:
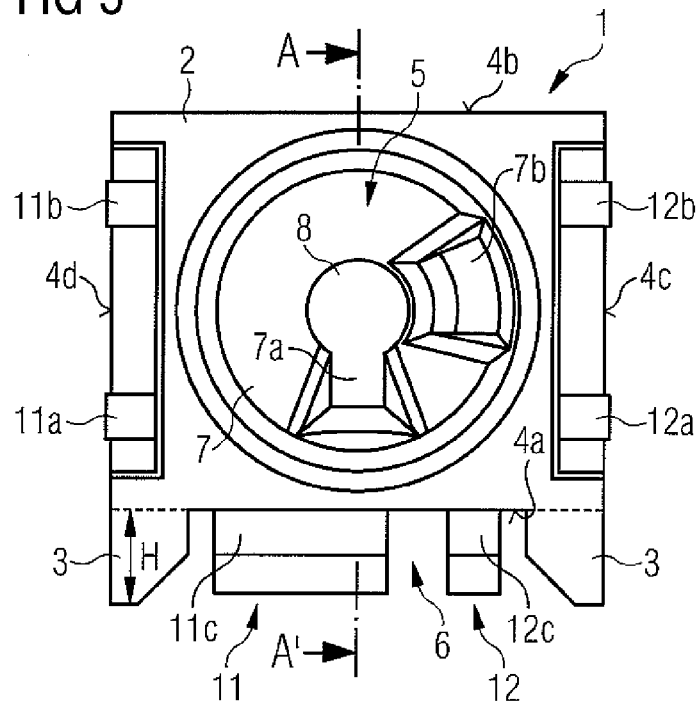
FIGS. 5 to 8 show various schematic views of a preferred exemplary embodiment of a housing.

FIG. 5 shows a schematic plan view of the front of a housing 1, which is preferably produced using the method described in relation to FIGS. 1 to 4.

The housing 1 comprises a housing body 2 and a first terminal strip 11 and a second terminal strip 12. A first side face 4a of the housing body 2 is arranged at an angle to the front and back of the housing body 2. The two terminal strips 11, 12 extend in part inside the housing body 2 and are guided out of the housing body 2 at the first side face 4a. Outside the housing body 2 the two terminal strips 11, 12 are bent in such a way that they comprise in each case a first portion 11c, 12c, which extends at an angle, preferably perpendicularly, to the first side face 4a, and in each case a second portion 11d (cf. FIG. 6), which extends with a spacing D (cf. FIG. 6) along the first side face 4a, preferably parallel or at an angle of less than 2° to the first side face 4.

On the side with the two terminal strips 11, 12, the housing 2 comprises supporting elements 3, which protrude from the plane of the side face 4a. The supporting elements 3 are preferably part of the housing body 2. They serve to support the housing. The weight of the housing does not therefore press down on the two terminal strips 11, 12, but rather on the supporting elements 3. To ensure this, the supporting elements 3 advantageously have a height H, which corresponds at least to the spacing D plus the thickness S (cf. FIG. 6) of the terminal strips 11, 12. In addition, the supporting elements 3 are preferably not narrower than a gap 6 between the two terminal strips 11, 12. This may prevent the supporting elements 3 of one housing from hooking up with the gap 6 of another housing.

The housing body 2 comprises a central recess 5, in which an optoelectronic semiconductor chip may be arranged. The semiconductor chip may be arranged on an extension 11e (cf. FIG. 2) of the first terminal strip 11. The extension 11e is located at the bottom 8 of the recess 5 and projects thereinto (not shown in FIG. 5).

The internal wall 7 of the housing body 2, which laterally defines the recess 5, is substantially rotationally symmetrical in shape and comprises a smooth surface. Solely in the area of the two terminal strips 11, 12 the internal wall 7 is provided with holes 7a, 7b, which provide access to the two terminal strips 11, 12. In particular the area of the second terminal strip 12 exposed by the hole 7b is provided for attachment of a bonding wire. The bonding wire then extends from the second terminal strip 12 to the semiconductor chip, which may be arranged at the bottom 8 of the recess 5. The semiconductor chip is preferably soldered to the extension 11e of the first terminal strip 11 projecting into the recess. The semiconductor chip may be supplied with electricity by means of the first and second terminal strip 11, 12.

Unlike the recess 5, the housing body 2 has a rotationally symmetrical basic shape, if solely the basic shape is taken into account which results from the boundary consisting of the first side face 4a, the second side face 4b and the third and fourth side faces 4c, 4d extending at an angle thereto.

The shape of the internal wall 7 resembles in particular the outer circumferential surface of a truncated cone, which opens towards the front. A high reflectivity material is advantageously used for the housing body 2, such that the internal wall 7 constitutes a reflector. In particular the housing body 2 contains a material which appears white, preferably PPA.

Remaining portions of the connecting webs 11a, 11b, 12a, 12b protrude from the housing body 2 on the third and fourth side faces 4c, 4d. Said remaining portions are left over when the housing is severed from the frame-type area 13 (cf. FIG. 4).

Figure 6:
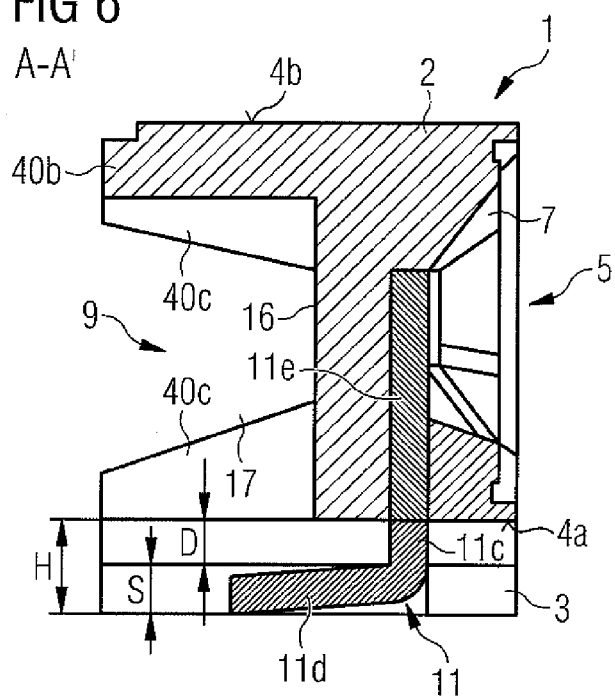

FIG. 6 shows a side view of a section through the housing 1 along line AA' (cf. FIG. 5). Here the profile of the first terminal strip 11 is readily apparent. One part of the first terminal strip 11 extends inside the housing body 2, from the recess 5 to the first side face 4a. A further part of the first terminal strip 11 is arranged outside the housing body 2 and may be subdivided into the first and second portions 11c, 11d, which extend at an angle to one another.

Furthermore it is clear from FIG. 6 that the housing body 2 comprises a cavity 9 at the back. The cavity 9 is defined by the rear wall 16, the second and third side walls 40b, 40c and the fourth side wall (not shown). The configuration of the housing body 2 with the cavity 9 may in particular prevent the occurrence of a blowhole when using an injection moulding method.

One end of the second portion 11d of the first terminal strip 11 and of the second terminal strip (not shown) extends into the cavity 9. Thus it is still possible, after mounting of the housing 1 on a terminal carrier, to work from the rear on the joint, in particular a soldered joint, between the housing 1 and the terminal carrier.

The second side wall 40b projects beyond the first terminal strip 11 and the second terminal strip and thus forms a type of canopy, by which the terminal strips are protected from above.

Figure 7:
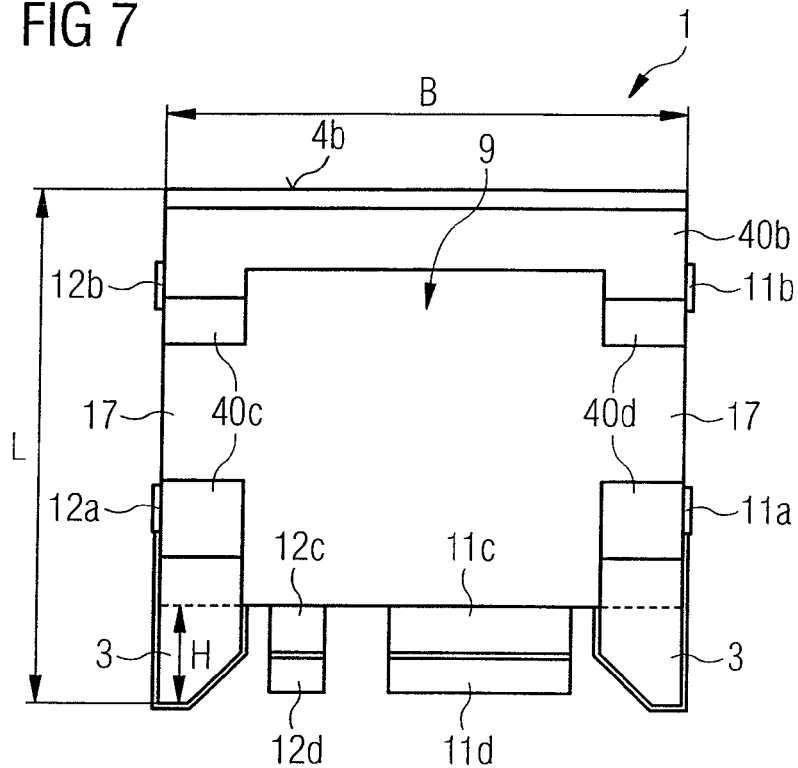

FIG. 7 shows a plan view of the back of the housing 1 shown in FIGS. 5 and 6. As is clear, the third side wall 40c and the fourth side wall 40d are not solid walls, but rather comprise openings 17. The openings 17 lead into the cavity 9. A holder may be inserted through the openings 17 and the cavity 9. The holder may fix the housing 1 during wire-bonding of a semiconductor chip.

Figure 8:
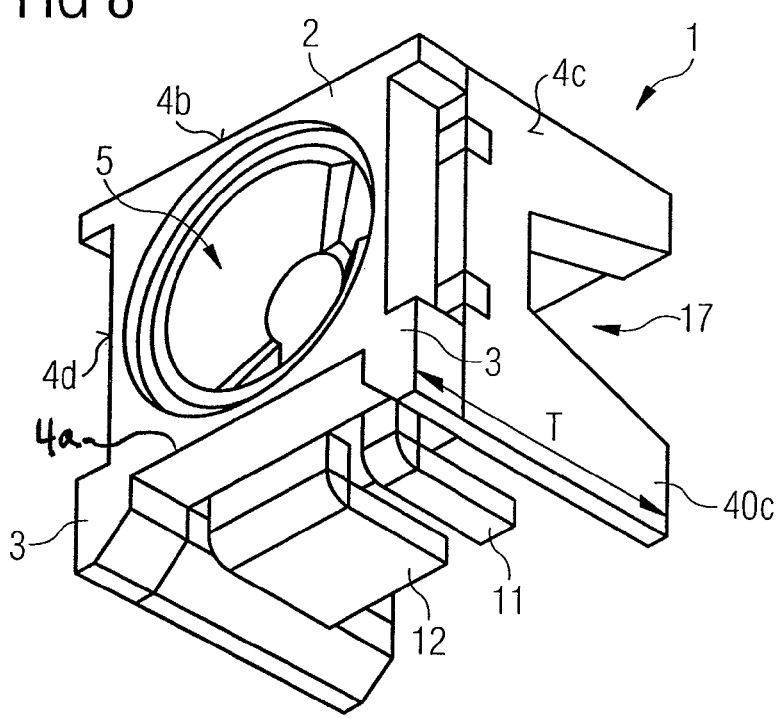

FIG. 8 shows a perspective view of the housing 1 shown in FIGS. 5 to 7. The supporting elements 3 resemble runners and extend along the third and fourth side faces 4c, 4d from the front to the back of the housing body 2.

The second side face 4b advantageously comprises a square face, such that there is no fear of tipping when the housing 1 is held by suction.

According to one preferred embodiment the housing 1 has the following dimensions: a width B of 4.6 mm and a height L of 4.6 mm (cf. FIG. 7), and additionally a depth T of 3.8 mm (cf. FIG. 8). The height H of the supporting elements may amount to 0.85 mm.

Preferably, terminal strips with a thickness of 0.34 mm are used. Such terminal strips enable good heat dissipation out of the housing 1. The majority of said heat arises in the area of the semiconductor chip, i.e. in the present case in the area of the first terminal strip 11. Therefore, the first terminal strip 11 is advantageously wider than the second terminal strip 12.

In the case of a side emitting component, a radiation emitting semiconductor chip (not shown) is arranged in the recess 5. The housing 1 is mounted on a terminal carrier on the side with the two terminal strips 11, 12. The second portions 11d, 12d preferably extend along the terminal carrier and are connected electrically thereto. In operation the semiconductor chip emits radiation in a main direction of radiation, which extends parallel to the preferably flat terminal carrier.

The invention is not limited to the exemplary embodiments as a result of the description made with reference thereto, but instead the invention encompasses any novel feature and any combination of features, including in particular any combination of features in the claims, even if this feature or this combination is not itself explicitly indicated in the claims or exemplary embodiments.

The invention claimed is:

1. A housing for an optoelectronic component, the housing comprising:
   a housing body comprising a first side face arranged at an angle to a front and a back of the housing body;
   first and second electrical terminal strips for supplying an optoelectronic semiconductor chip with electricity, the first and second electrical terminal strips each having a first part inside the housing body and a second part guided out of the housing body at the first side face, the second parts of the first and second electrical terminal strips being bent outside the housing body to form a first portion extending at an angle to the first side face, and a second portion extending along the first side face, spaced at a spacing from the first side face; and
   supporting elements connected to the housing body, wherein the supporting elements have an elongate shape, extend from the front to the back of the housing body, project out of a plane of the first side face, and form a tunnel-like cavity,
   wherein the first and second electrical terminal strips are within the tunnel-like cavity.

2. The housing according to claim 1, wherein the spacing between the first side face and the second portions of the terminal strips is between 0.4 mm and 0.6 mm in size.

3. The housing according to claim 1, wherein the first and second portions form an angle which is greater than 90°.

4. The housing according to claim 1, wherein the terminal strips are at least 0.2 mm thick.

5. The housing according to claim 1, wherein the supporting elements have a height corresponding at least to the spacing of the second portions from the first side face plus the thickness of the terminal strips.

6. The housing according to claim 1, wherein the housing body further comprises a second, square-shaped side face arranged parallel to the first side face.

7. The housing according to claim 1, wherein the housing body further comprises a third side wall and a fourth side wall each arranged at an angle to the first side face, the third and fourth side walls each defining respective openings.

8. The housing according to claim 7, wherein the respective openings lead into a rear cavity in the housing body.

9. The housing according to claim 1, wherein the first and second electrical terminal strips are separated from one another by a gap which is smaller than the width of the supporting elements.

10. The housing according to claim 1, wherein the housing body comprises a recess at the front to accommodate the optoelectronic semiconductor chip.

11. The housing according to claim 10, wherein an extension of the first electrical terminal strip extending inside the housing body projects into the recess.

12. A side emitting component having a housing according to claim 1, and a radiation emitting semiconductor chip arranged inside the housing body, wherein the component is configured to be arranged on a terminal carrier so that the second portions of the terminal strips extend along the terminal carrier for connection to the terminal carrier by an electrically conductive joining agent.

13. A method of producing a housing according claim 1, comprising:
   introducing a terminal frame with a first electrical terminal strip and a second electrical terminal strip, the first and second electrical terminal strips being flat, into a shaping device, wherein a first and a second portion of the first and second electrical terminal strips project out of the device;
   filling the device with a housing body compound for forming the housing body, to at least partially embed the first and second electrical terminal strips in the housing body compound;
   bending the first and second electrical terminal strips before or after completion of the housing body, such that the first portions of the first and second electrical terminal strips extend at an angle to the second portion; and connecting first and second supporting elements to the housing body, from the front to the back of the housing body, wherein the first and second supporting elements project out of the plane of the first side face, have an elongate shape, and form a tunnel-like cavity receiving the first and second electrical terminal strips.

14. The method according to claim 13, comprising injection molding the housing body from thermoplastic material.

\* \* \* \* \*